(12) United States Patent
Reynolds et al.

(10) Patent No.: US 11,973,454 B2
(45) Date of Patent: Apr. 30, 2024

(54) PRELOAD CONTROL SYSTEM

(71) Applicant: Bell Textron Inc., Fort Worth, TX (US)

(72) Inventors: Robert Reynolds, Euless, TX (US); Charles Eric Covington, Colleyville, TX (US); Carlos Alexander Fenny, Fort Worth, TX (US); Brady G. Atkins, Euless, TX (US)

(73) Assignee: Textron Innovations Inc., Providence, RI (US)

( * ) Notice: Subject to any disclaimer, the term of this patent is extended or adjusted under 35 U.S.C. 154(b) by 46 days.

(21) Appl. No.: 17/540,278

(22) Filed: Dec. 2, 2021

(65) Prior Publication Data

US 2023/0179126 A1 Jun. 8, 2023

(51) Int. Cl.
| | |
|---|---|
| *H02P 6/06* | (2006.01) |
| *B60W 10/08* | (2006.01) |
| *G01R 31/34* | (2020.01) |
| *H02P 1/26* | (2006.01) |
| *H02P 6/185* | (2016.01) |

(52) U.S. Cl.
CPC ............... *H02P 6/06* (2013.01); *B60W 10/08* (2013.01); *G01R 31/343* (2013.01); *H02P 1/26* (2013.01); *H02P 6/185* (2013.01); *B60W 2420/50* (2013.01); *B60W 2420/90* (2013.01)

(58) Field of Classification Search
CPC .. H02P 6/06; H02P 1/26; H02P 6/185; B60W 10/08; B60W 2420/50; B60W 2420/90; G01R 31/343
See application file for complete search history.

(56) References Cited

U.S. PATENT DOCUMENTS

| | | | |
|---|---|---|---|
| 6,220,545 B1* | 4/2001 | Fenny | B64C 29/0033 244/99.2 |
| 6,227,481 B1* | 5/2001 | Fenny | B64C 29/0033 244/66 |
| 6,640,949 B1* | 11/2003 | Vranish | F16D 41/07 192/41 A |
| 11,332,256 B2* | 5/2022 | Hon | B64D 27/24 |
| 2005/0080495 A1* | 4/2005 | Tessier | B64C 13/503 700/63 |
| 2009/0321558 A1* | 12/2009 | Pitt | B64C 3/52 244/48 |
| 2020/0207467 A1* | 7/2020 | Morgan | B64C 27/52 |
| 2022/0349406 A1* | 11/2022 | Bartov | G05D 7/0676 |

* cited by examiner

*Primary Examiner* — Rina I Duda
(74) *Attorney, Agent, or Firm* — Lightfoot & Alford PLLC

(57) ABSTRACT

A system includes a driver monitor system configured to receive information about driver operation, a relationship table comprising information about an expected relationship between driver operation and a preload force, and a driver controller configured to control a driver in response to the information about driver operation and according to the relationship table. A method of managing a preload force includes providing a first component, providing a second component for compression against the first component, operating a driver to move the first component into contact with the second component, monitoring an operation of the driver, and determining an expected preload force in response to the operation of the driver.

19 Claims, 12 Drawing Sheets

PRELOAD CONTROL SYSTEM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

Tilt rotor aircraft are hybrids between traditional helicopters and traditional propeller driven aircraft. Typical tilt rotor aircraft have fixed wings that terminate with convertible tilt rotor assemblies that house the engines and transmissions that drive the rotors. Tilt rotor aircraft are convertible from a helicopter mode, in which the tilt rotor aircraft can take-off, hover, and land like a helicopter; to an airplane mode, in which the tilt rotor aircraft can fly forward like a fixed-wing aircraft.

Aside from the usual problems that must be addressed when designing either helicopters or propeller driven aircraft, the design of tilt rotor aircraft poses unique problems not associated with either helicopters or propeller driven aircraft. In particular, because the wings of tilt rotor aircraft must be designed to function in both the helicopter mode and the airplane mode, traditional design criteria used for helicopters or propeller driven aircraft alone are not sufficient. For example, the wings of tilt rotor aircraft often accommodate and support fuel tanks, interconnecting drive shafts from one engine to the other, interconnecting drive shafts from one conversion actuator to the other, redundant drive shafts, and spindles about which the tilt rotor assemblies and conversion actuators pivot. For these reasons, the space within the wings is extremely limited, resulting in little or no room for intrusive devices, measuring devices, sensing devices, or additional structural supports. Nevertheless, certain loads, both static and dynamic, must be carried by the wings of tilt rotor aircraft that are not present in either helicopters or fixed wing aircraft.

In a typical tilt rotor aircraft, the interconnecting drive shafts from one engine to the other are located near the trailing edges of the wings, as are the main spindles about which the tilt rotor assemblies pivot. Hydraulic conversion actuators for actuating the tilt rotor assemblies are pivotally carried at the wing tips and, in some instances, interconnected by shafts that run along the leading edges of the wings. This arrangement does not create problems when the tilt rotor aircraft is operating in the helicopter mode; but when the tilt rotor aircraft converts to the airplane mode, certain oscillatory vibration loads, such as longitudinal pitch loads and lateral yaw loads, are created by the rotors. Because of these unique airplane-mode loads, if a minimal structural stiffness is not maintained between the tilt rotor assembly and the wing, then the aircraft will become unstable. This minimal structural stiffness is based upon airplane-mode aircraft speed and related load factors. The internal preload of the conversion actuator increases the effective pitch stiffness of the tilt rotor assembly, but has little or no effect on the yaw stiffness of the tilt rotor assembly. To improve yaw stiffness, downstop assemblies with interlocking yaw restraints are used. However, the interlocking yaw restraints are only safe and effective if the tilt rotor assembly is forced against the wing so as to generate a preload sufficient to satisfy static and dynamic load requirements.

Certain attempts have been made to measure and maintain a selected preload between the tilt rotor assembly and the wing while the tilt rotor aircraft is in the airplane mode, but none have adequately resolved the problem. For example, in some tilt rotor aircraft, the preload between the tilt rotor assembly and the wing is measured using a complex closed loop algorithm that uses conversion actuator motor pressure to determine the preload between the tilt rotor assembly and the wing. In these applications, the preload between the tilt rotor assembly and the wing can be set, but with only limited accuracy. In other tilt rotor assemblies, an open loop system is employed in which the conversion actuators simply force the tilt rotor assembly into contact with the wing until the conversion actuator stalls. Such systems are undesirable in certain applications because allowing the preload to go to high requires added structural support resulting in increased weight and cost. In addition, these prior-art systems do not adequately compensate for the dynamic loads generated when the tilt rotor aircraft pulls up or goes into a dive.

Although great strides have been made in the design of tilt rotor aircraft, the problem of managing the preload between a tilt rotor downstop assembly and a wing has not been adequately resolved.

DETAILED DESCRIPTION

In this disclosure, reference may be made to the spatial relationships between various components and to the spatial orientation of various aspects of components as the devices are depicted in the attached drawings. However, as will be recognized by those skilled in the art after a complete reading of this disclosure, the devices, members, apparatuses, etc. described herein may be positioned in any desired orientation. Thus, the use of terms such as "above," "below,"

"upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Unlike previous attempts to manage preloads applied between aircraft structural components, embodiments disclosed herein are focused on estimating and managing preloads by various proxy means, rather than by direct load measurement using strain gages or other direct measurement techniques. Instead, this disclosure teaches utilization of predetermined and/or learned relationships between performance and displacement of various system components to provide a trusted and accurate representation of preloads. In some cases, the systems disclosed herein can be open loop in nature so that the determined preloads are obtained and trusted without requiring verification during operations in the field while in other embodiments the system can operate in a closed loop nature so that closed loop control of preloads can be achieved, thereby allowing a proxy feedback for use in applying and/or adjusting a preload.

Figure 1:
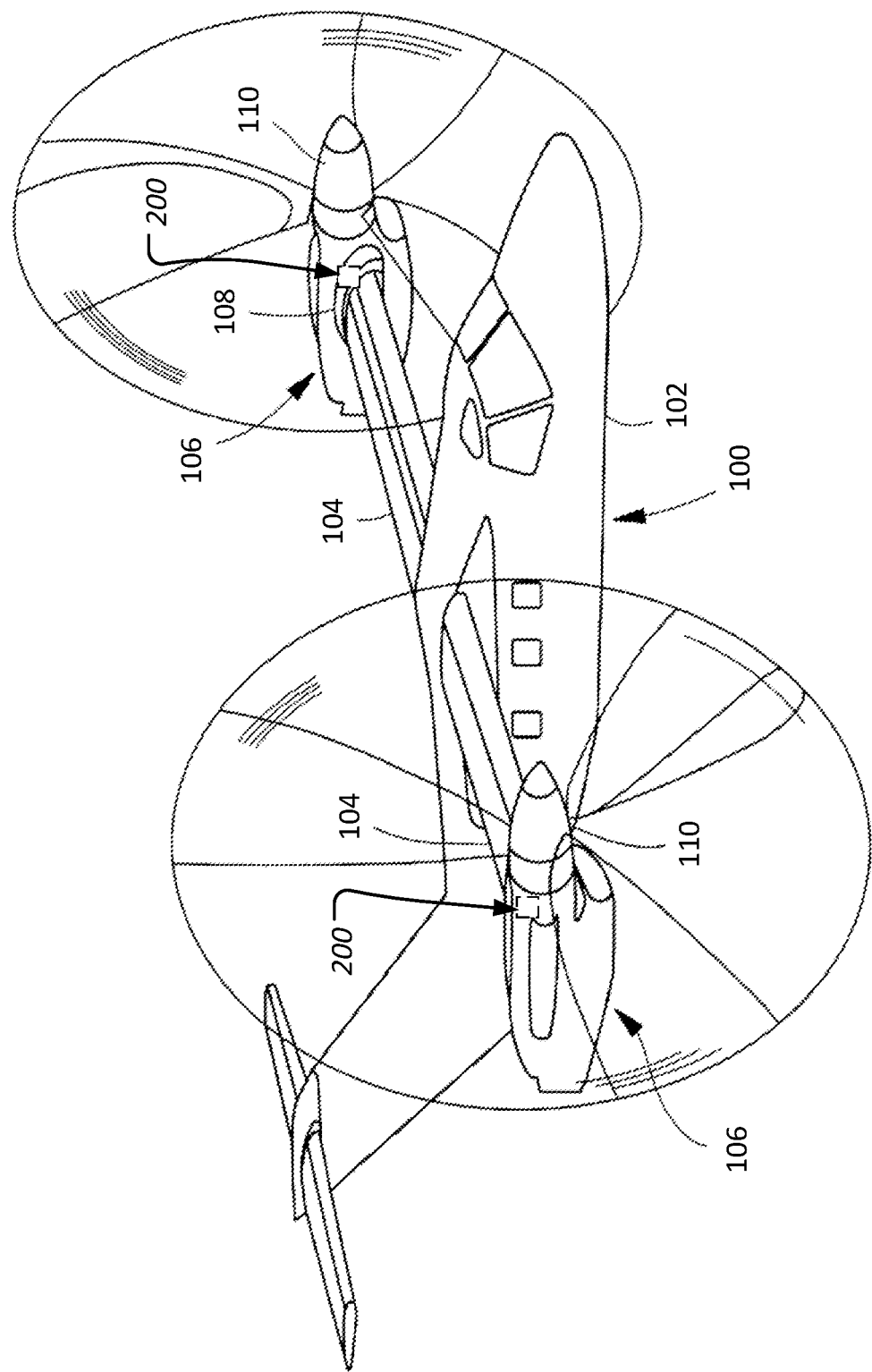
FIG. 1 illustrates an oblique view of a tilt rotor aircraft in an airplane mode according to an embodiment of this disclosure.
Figure 2:
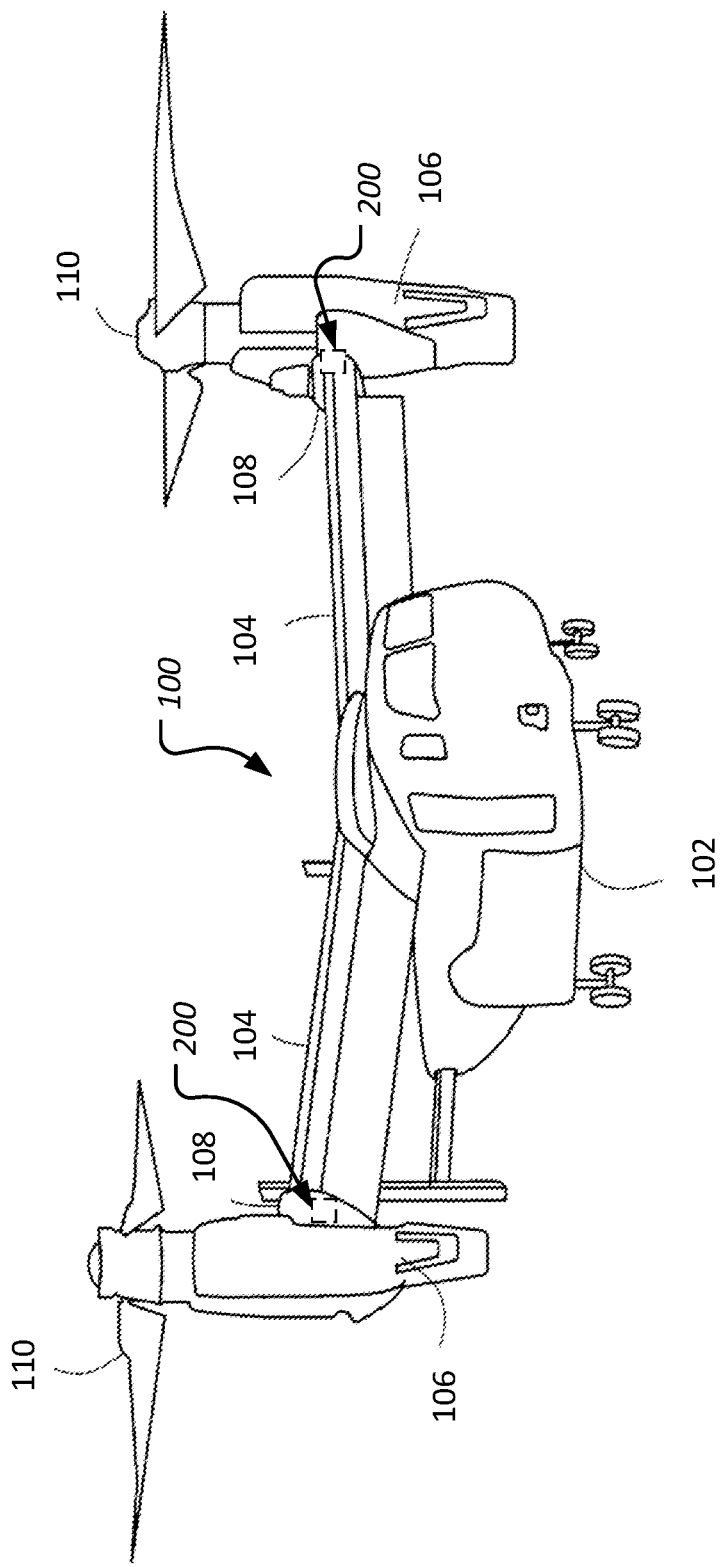
FIG. 2 illustrates an oblique view of the tilt rotor aircraft of FIG. 1 in a helicopter mode according to an embodiment of this disclosure.

Referring to FIGS. 1 and 2 in the drawings, a tilt rotor aircraft 100 is illustrated. Tilt rotor aircraft 100 has an airframe 102 and wings 104 coupled to airframe 102. Wings 104 terminate with tilt rotor assemblies 106. Fairings 108 for reducing drag are disposed between tilt rotor assemblies 106 and wings 104. Tilt rotor assemblies 106 each generally include an engine, a transmission and gear box for driving proprotors 110, and a conversion actuator system 200 for actuating tilt rotor assemblies 106 between an airplane mode, as illustrated in FIG. 1, and a helicopter mode, as illustrated in FIG. 2. In the airplane mode, tilt rotor aircraft 100 can be flown and operated like a conventional fixed-wing propeller driven aircraft. In the helicopter mode, tilt rotor aircraft 100 can take-off, hover, land, and be operated like a conventional rotary wing aircraft or helicopter. Tilt rotor aircraft 100 further comprises a flight control computer 120 configured to receive and issue control commands related to operating in the airplane mode, the helicopter mode, and therebetween.

Figure 3:
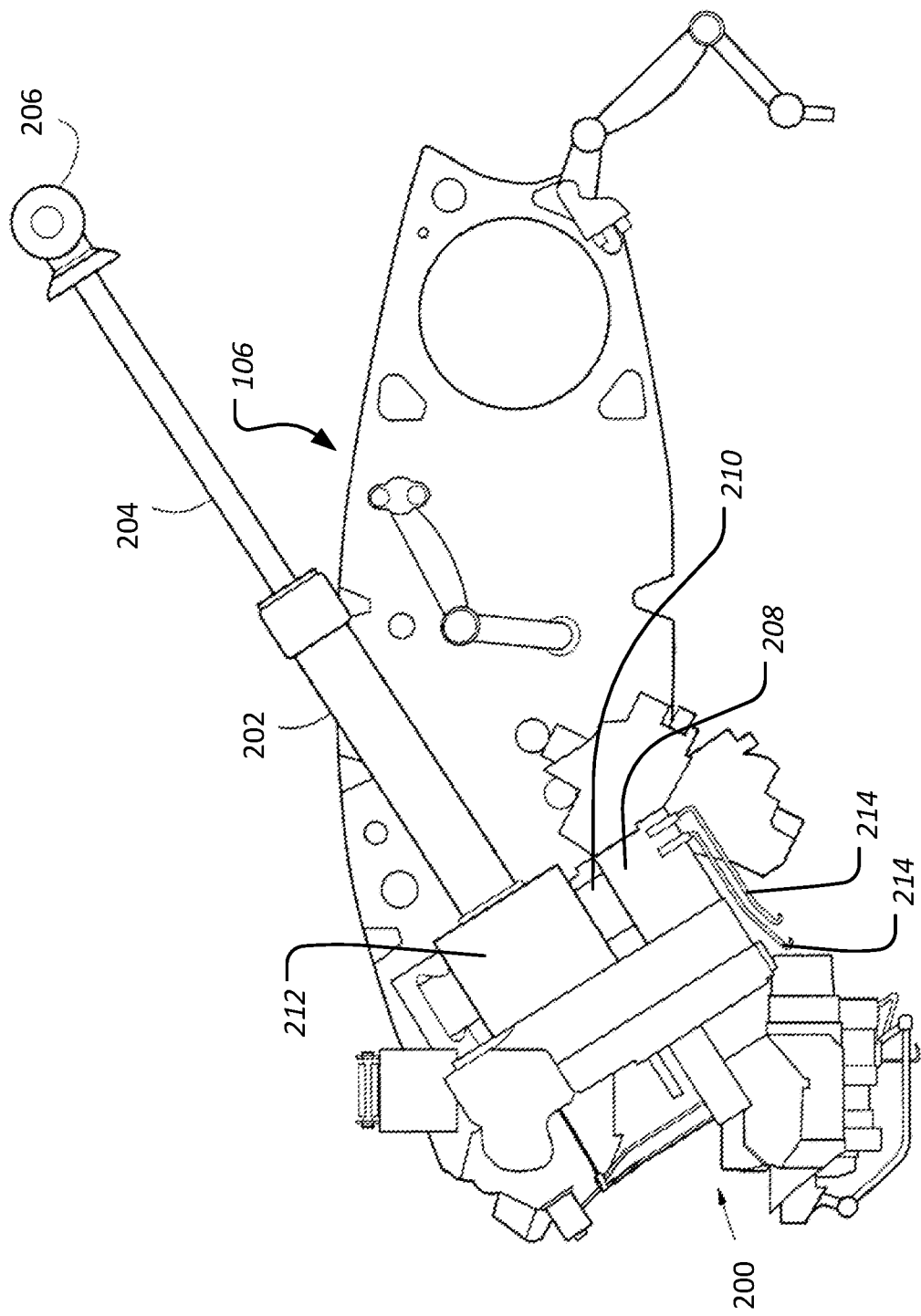
FIG. 3 is a side view of a conversion actuator system of the tilt rotor aircraft of FIG. 1 according to an embodiment of this disclosure.

Referring now to FIG. 3 in the drawings, conversion actuator system 200 is shown in the helicopter mode. Conversion actuator system 200 comprises a ball screw type actuator having a retractable cylinder 202 and an extendable shaft 204 that carries a connection lug 206 for coupling to pylons. Conversion actuator system 200 forces tilt rotor assemblies 106 against wings 104, and provide a preload between tilt rotor assemblies 106 and wing 104. The amount of force and preload vary according to the application. For tilt rotor aircraft 100, the preferred values of the force and the selected preload, as well as the preferred tolerances, are dependent upon several factors, such as cost, weight, and complexity.

In this embodiment, conversion actuator system 200 further comprises a driver 208, a gearbox 210, and a driven interface 212. Driver 208 is shown as a direct current electric motor comprising two power leads 214. When direct current is supplied to driver 208 with a first polarity, the electric motor operates to turn gears within gearbox 210 which in turn interacts with driven interface 212 to extend extendable shaft 204. When direct current is supplied to driver 208 with a second polarity that is opposite the first polarity, electric motor operates in a reverse direction to turn gears within gearbox 210 which in turn interacts with driven interface 212 to retract extendable shaft 204. It will be appreciated that with sufficient extension of extendable shaft 204, conversion actuator system 200 can configure aircraft 100 for use in the helicopter mode. Similarly, with sufficient retraction of extendable shaft 204, conversion actuator system 200 can configure aircraft 100 for use in the aircraft mode. As will be explained below, conversion actuator system 200 can be utilized to hold aircraft 100 in the aircraft mode with a desired downstop force. While some previous systems have provided for direct measurement and controlled application of downstop forces using strain gages at a downstop force interface, the systems disclosed herein do not require permanently installed strain gages, and in some cases, require no use of strain gages at all.

Figure 4:
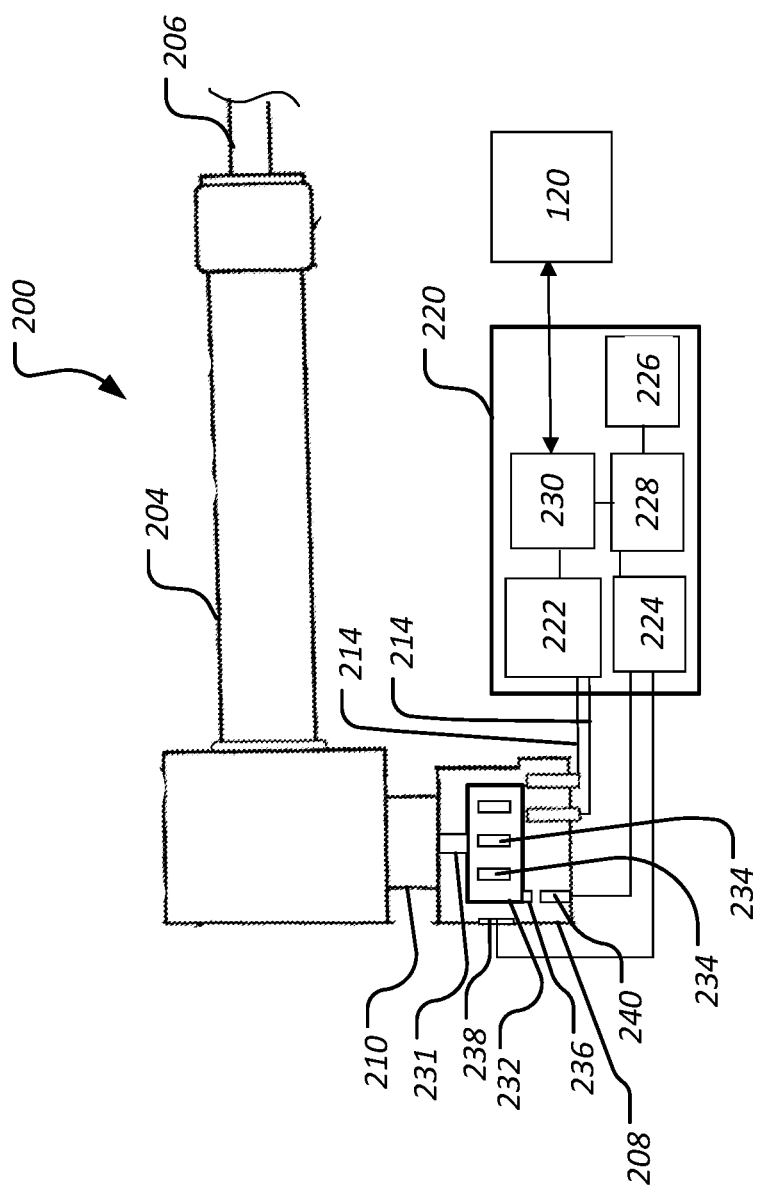
FIG. 4 is a schematic view of the conversion actuator system of FIG. 3.

Referring now to FIG. 4, conversion actuator system 200 is shown in isolation. Conversion actuator system 200 further comprises a preload control system 220 comprising a motor controller 222, a motor position monitor 224, a motor position downstop preload relationship table 226, a preload translator 228, and a comparator controller 230. As shown, driver 208 comprises a shaft 231 and a motor rotor 232 that can carry one or more optical targets 234 and one or more magnetic triggers 236. Optical targets 234 and magnetic triggers 236 can be disposed relative to an optical sensor 238 and a magnetic sensor 240, respectively, so that as the optical targets 234 and magnetic triggers 236 move past predetermined locations relative to the optical sensor 238 and the magnetic sensor 240, respectively, so that the motor position monitor 224 can receive and/or log rotational position information about motor rotor 232. It will be appreciated that in alternative embodiments, the optical and/or magnetic sensors and/or targets can be replaced by other position monitoring systems and components, such as, but not limited to, hall effect sensors, inductive sensors, magneto-resistive encoders, resistive encoders, mechanical encoders, optical encoders, synchronizers and/or resolvers, or any other suitable means of monitoring changes in position. Motor position downstop preload relationship table 226 can be housed in a computer readable medium or memory and is configured to comprise information regarding a provided or determined relationship between motor rotor 232 and an applied downstop preload, as will be explained in greater detail below with reference to FIG. 5. Preload translator 228 is a module configured to receive information from both motor position monitor 224 and table 226 to determine and report an estimated downstop preload value to comparator controller 230. Comparator controller 230 is configured to receive control information from flight control computer 120. In particular comparator controller 230 can receive an instruction from flight control computer 120 regarding a desired mode of flight, such as whether aircraft 100 is instructed to fly and the airplane mode or the helicopter mode. In situations where flight control computer 120 informs comparator controller 230 that aircraft 100 is being commanded to fly in the airplane mode, comparator controller 230 can compare the estimated downstop preload value received from preload translator 228 to the desired final downstop preload for use in airplane mode flight. When comparator controller 230 determines that the estimated downstop preload received from preload translator 228 is less than the desired downstop preload, comparator controller 230 can instruct motor controller 222 to continue rotating motor rotor 232 in a manner that increases the applied downstop preload. Similarly, when comparator controller 230 determines that the estimated downstop preload is greater than the desired downstop preload, comparator controller 230 can instruct motor controller 222 to reverse rotation of motor rotor 232 to reduce the applied downstop preload.

Figure 5:
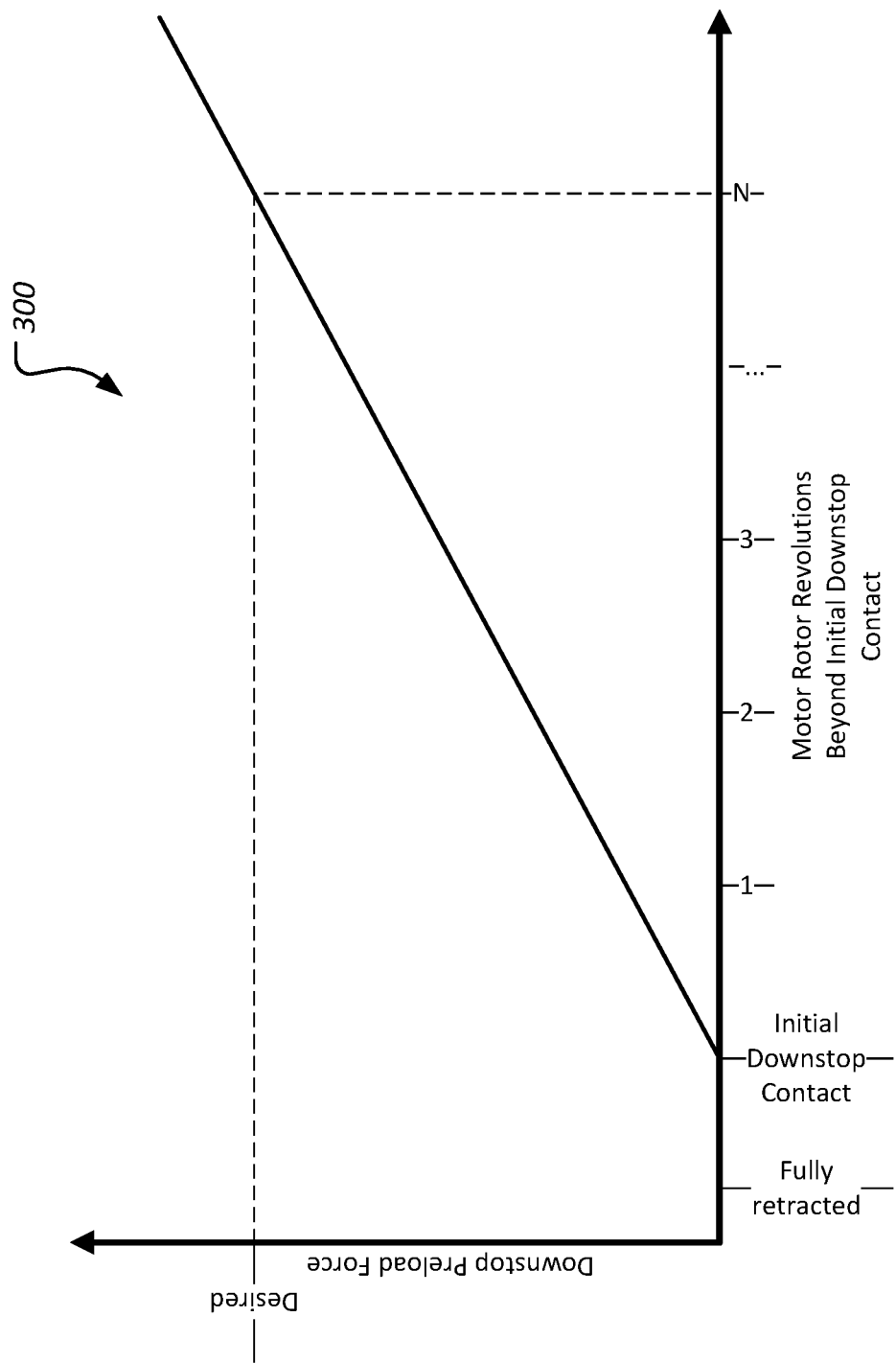
FIG. 5 is a chart showing a relationship between a motor rotor position and a downstop preload.

Referring now to FIG. 5, a chart 300 is provided that shows a relationship between a number of motor rotor revolutions beyond an initial downstop contact between two components being forced together and a known or estimated downstop preload force. In some embodiments, the relationship can be determined through engineering modeling and simulations while in other embodiments, the relationship can be gathered by using additional instrumentation, such as, but not limited to, strain gages configured to assist with measuring applied forces. In some cases, a relationship can be determined on a first aircraft and subsequently utilized in the control of a second aircraft. As shown, no downstop preload force exists until the components being forced together actually contact each other. In some cases the relationship can be substantially linear and therefore a known amount of rotation as measured in revolutions or portions of revolutions can be used to estimate an applied downstop preload force. It will be appreciated that by using a relatively higher number of optical reflectors, magnetic triggers, and/or any other suitable angular displacement measurement tools, the estimated downstop preload force can be estimated with greater precision. It will be appreciated that in alternative embodiments, the optical and/or magnetic sensors and/or targets used for angular measurement can be replaced by other angular measurement monitoring systems and components, such as, but not limited to, hall effect sensors, inductive sensors, magneto-resistive encoders, resistive encoders, mechanical encoders, optical encoders, synchronizers and/or resolvers, or any other suitable means of monitoring changes in position.

Figure 6:
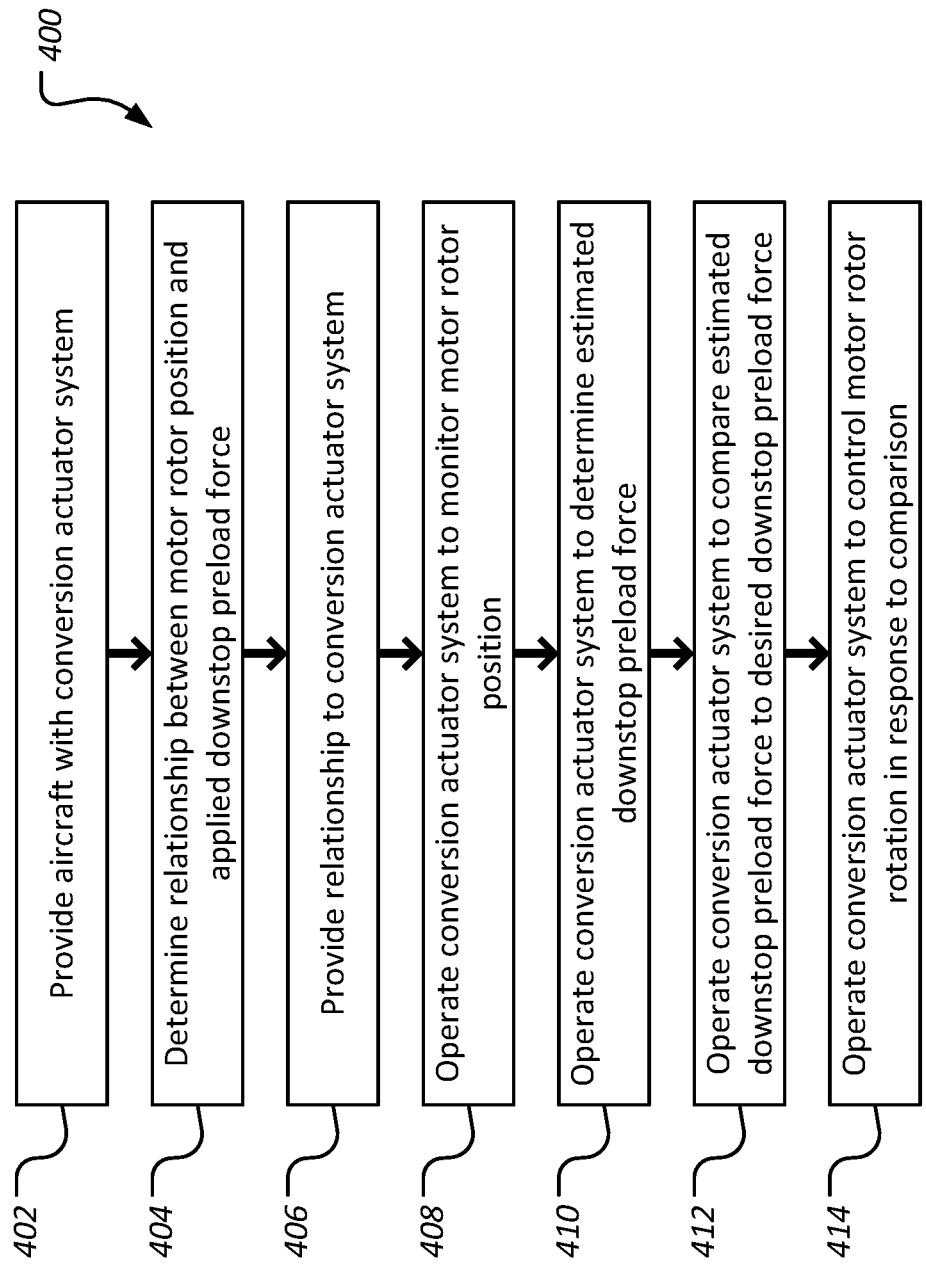
FIG. 6 is a flowchart of a method of operating the conversion actuator system of FIG. 3.

Referring now to FIG. 6, a flowchart of a method 400 of operating conversion actuator system 200 is shown. Method 400 can begin at block 402 by providing an aircraft with a conversion actuator system such as conversion actuator system 200. Method 400 can continue at block 404 by determining a relationship between a motor rotor position and an applied downstop preload force. In some cases, the relationship can be determined from instrumentation on the aircraft while in other cases the relationship can be determined independent of the aircraft. Next, method 400 can continue by providing the determined relationship to the conversion actuator system. In some cases, this involves storing the relationship and a memory in the form of a table such as motor position downstop preload relationship table 226. Next, at block 408 the conversion actuator system can be operated to monitor motor rotor position. Monitoring motor rotor position can involve counting revolutions, monitoring known hard stop positions, determining an initial contact between two components forced together, and any other suitable kinematic relationship between motor rotor position and resultant spatial location of components and/or estimated forces. Next, at block 410 the conversion actuator system can be operated to determine an estimated downstop preload force by translating a received motor rotor location into an estimated downstop preload force using the above-described relationship provided to the conversion actuator system. Method 400 can continue at block 412 by operating the conversion actuator system to compare an estimated downstop preload force to a commanded or desired downstop preload force. In some cases the commanded or desired downstop preload force can be provided to the conversion actuator system by a flight control computer such as flight control computer 120. Method 400 can conclude by operating the conversion actuator system to control the motor rotor rotation in response to the above-describe comparison so that, for example, if an estimated downstop preload force is lower than a desired or commanded downstop preload force, conversion actuator system can control the motor to rotate the motor rotor in a manner that increases the estimated downstop preload force.

Figure 7:
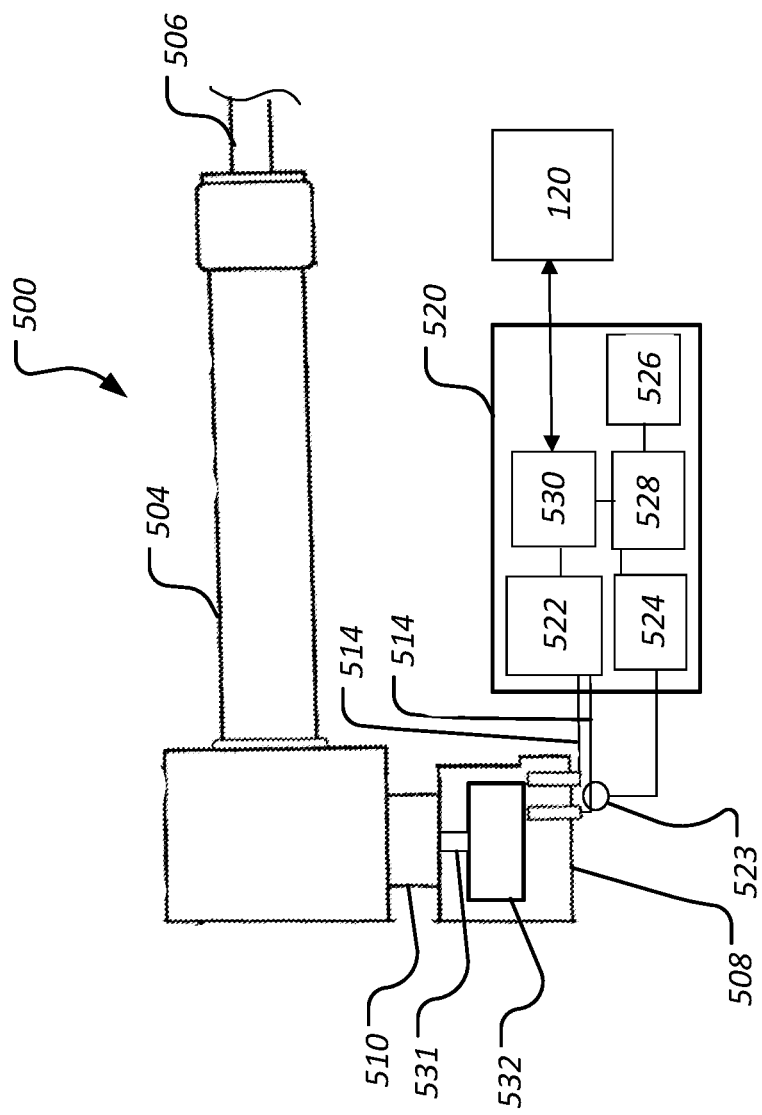
FIG. 7 is a schematic view of an alternative embodiment of a conversion actuator system.

Referring now to FIG. 7, conversion actuator system 500 is shown in isolation. Conversion actuator system 500 is substantially similar to conversion actuator system 200. However, conversion actuator system 500 utilizes motor amperage information rather than motor rotor location information. Conversion actuator system 500 further comprises a preload control system 520 comprising a motor controller 522, a motor ammeter system 524, a motor position downstop preload relationship table 526, a preload translator 528, and a comparator controller 530. As shown, driver 508 comprises a shaft 531 and a motor rotor 532. Motor position downstop preload relationship table 526 can be housed in a computer readable medium or memory and is configured to comprise information regarding a provided or determined relationship between a driver or motor amperage or load draw as measured by ammeter 523 and an applied downstop preload, as will be explained in greater detail below with reference to FIG. 8. Preload translator 528 is a module configured to receive information from both motor ammeter system 524 and table 526 to determine and report an estimated downstop preload value to comparator controller 530. Comparator controller 530 is configured to receive control information from flight control computer 120. In particular comparator controller 530 can receive an instruction from flight control computer 120 regarding a desired mode of flight, such as whether aircraft 100 is instructed to fly and the airplane mode or the helicopter mode. In situations where flight control computer 120 informs comparator controller 530 that airplane 100 is being commanded to fly in the airplane mode, comparator controller 530 can compare the estimated downstop preload value received from preload translator 528 to the desired final downstop preload for use in airplane mode flight. When comparator controller 530 determines that the estimated downstop preload received from preload translator 528 is less than the desired downstop preload, comparator controller 530 can instruct motor controller 522 to continue rotating motor rotor 532 in a manner that increases the applied downstop preload. Similarly, when comparator controller 530 determines that the estimated downstop preload is greater than the desired downstop preload, comparator controller 530 can instruct motor controller 522 to reverse rotation of motor rotor 532 to reduce the applied downstop preload.

Figure 8:
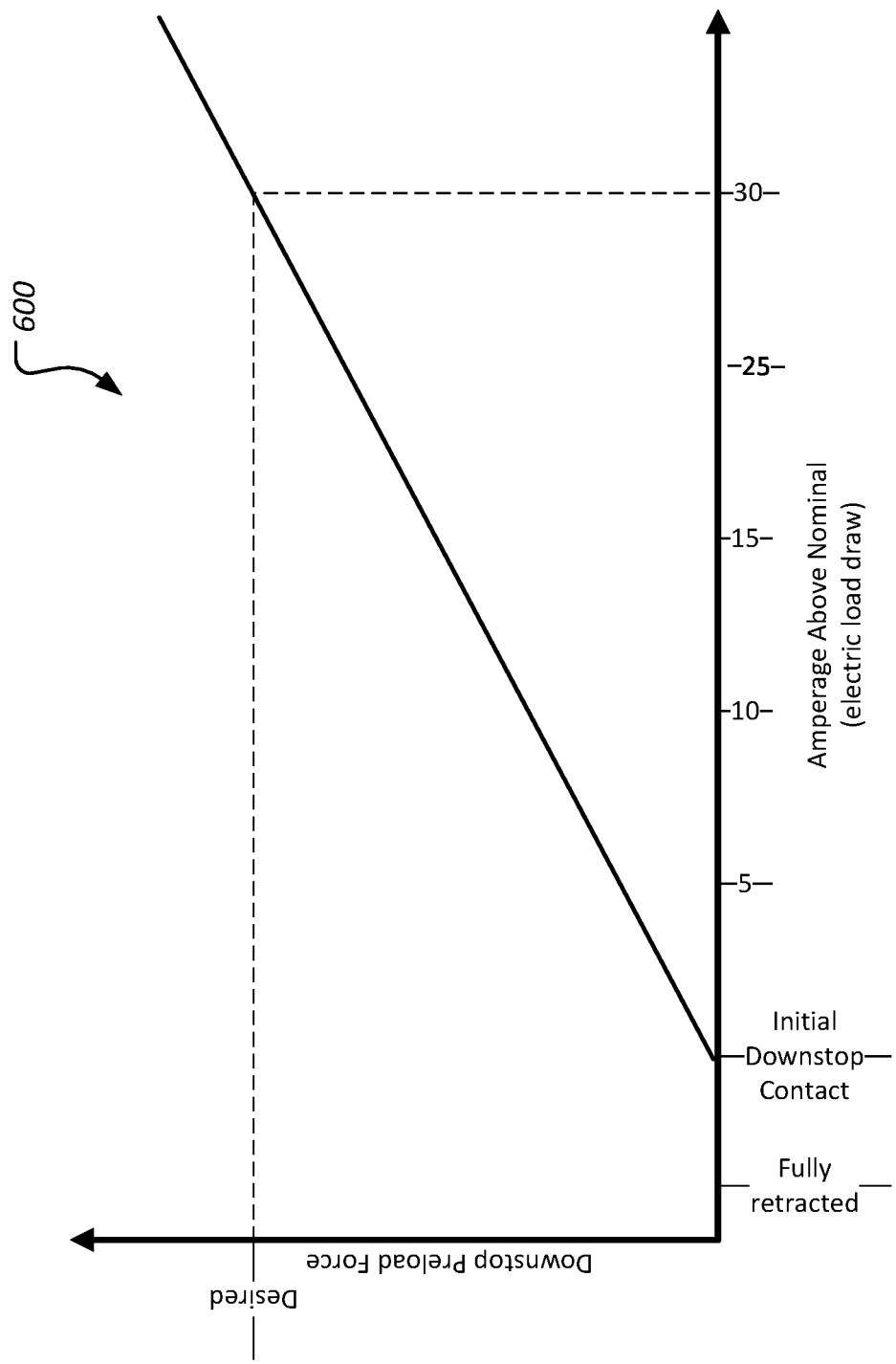
FIG. 8 is a chart showing a relationship between and amperage and a downstop preload.

Referring now to FIG. 8, a chart 600 is provided that shows a relationship between a number of amperes drawn in excess of normal operational current and a known or estimated downstop preload force. In some embodiments, the relationship can be determined through engineering modeling and simulations while in other embodiments, the relationship can be gathered by using additional instrumentation, such as, but not limited to, strain gages configured to assist with measuring applied forces. In some cases, a relationship can be determined on a first aircraft and subsequently utilized in the control of a second aircraft. As shown, no downstop preload force exists until the components being forced together actually contact each other. In some cases the relationship can be substantially linear and therefore a known amount additional amperage (in excess of nominal current consumption during motor use prior to preload force being generated) can be used to estimate an applied downstop preload force.

Figure 9:
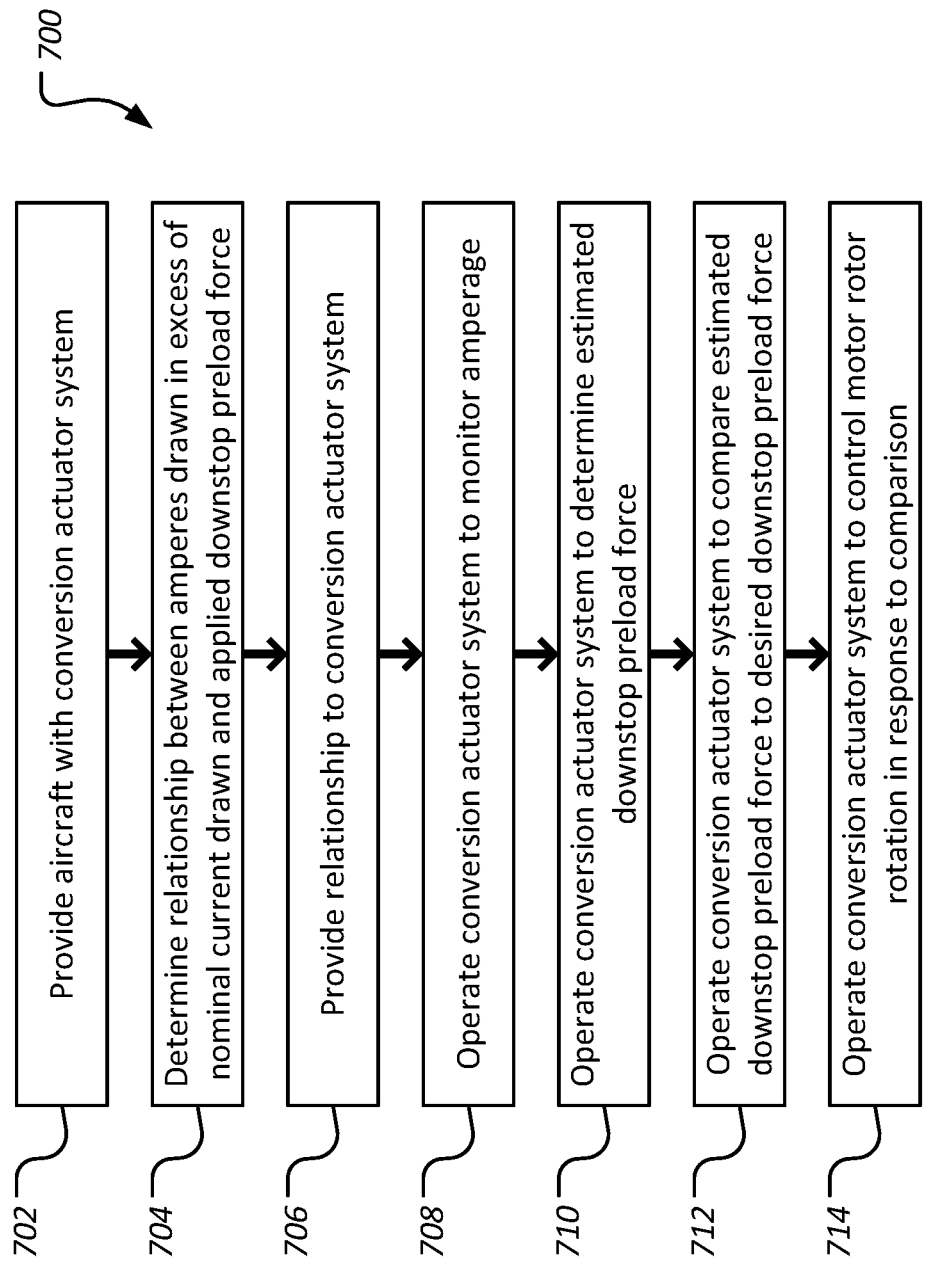
FIG. 9 is a flowchart of a method of operating the conversion actuator system of FIG. 7.

Referring now to FIG. 9, a flowchart of a method 700 of operating conversion actuator system 500 is shown. Method 700 can begin at block 702 by providing an aircraft with a conversion actuator system such as conversion actuator system 500. Method 700 can continue at block 704 by determining a relationship between amperes drawn and an applied downstop preload force. In some cases, the relationship can be determined from instrumentation on the aircraft while in other cases the relationship can be determined independent of the aircraft. Next, method 700 can continue by providing the determined relationship to the conversion actuator system. In some cases, this involves storing the relationship and a memory in the form of a table such as motor position downstop preload relationship table 526. Next, at block 708 the conversion actuator system can be operated to monitor amperes or current load drawn by the a driver such as driver 508. Next, at block 710 the conversion actuator system can be operated to determine an estimated downstop preload force by translating a received measured amperage value into an estimated downstop preload force using the above-described relationship provided to the conversion actuator system. Method 700 can continue at block 712 by operating the conversion actuator system to compare an estimated downstop preload force to a commanded or desired downstop preload force. In some cases the commanded or desired downstop preload force can be provided to the conversion actuator system by a flight control computer such as flight control computer 120. Method 700 can conclude by operating the conversion actuator system to control the motor rotor rotation in response to the above-describe comparison so that, for example, if an estimated downstop preload force is lower than a desired or commanded downstop preload force, conversion actuator system can control the motor to rotate the motor rotor in a manner that increases the estimated downstop preload force.

Figure 10:
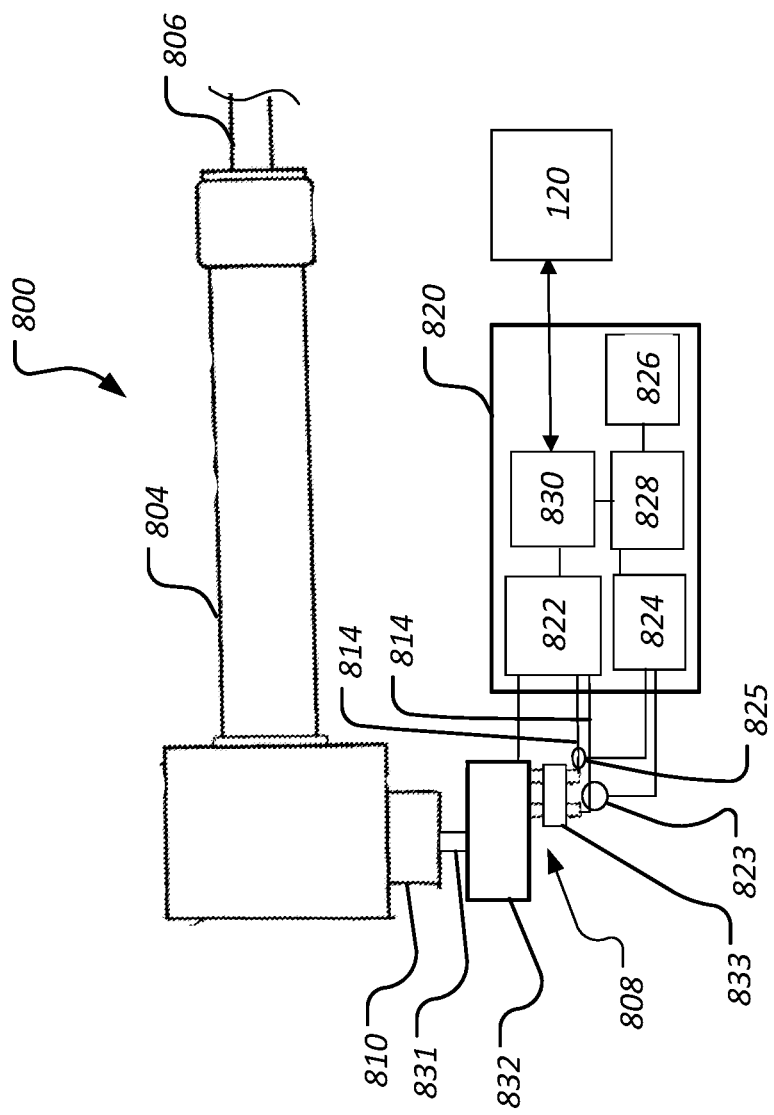
FIG. 10 is a schematic view of an alternative embodiment of a conversion actuator system.

Referring now to FIG. 10, conversion actuator system 800 is shown in isolation. Conversion actuator system 800 is substantially similar to conversion actuator systems 200 and 500. However, rather than an electric motor being used as a driver, driver 808 comprises a hydraulic motor 832 controlled by an electro-hydraulic valve 833 that is controlled and/or managed by a hydraulics pump and controller system 822. In this embodiment, hydraulic motor 832 comprises a fixed displacement hydraulic motor so that motor torque and actuator force are substantially proportional to a differential between hydraulic motor 832 input pressure and hydraulic motor 832 output pressure. In an alternative embodiment where the hydraulic motor comprises a variable displacement hydraulic motor (such as a swashplate hydraulic motor), hydraulic motor torque and actuator force are substantially proportional to a motor swashplate angle. In yet another alternative embodiment, such a hydraulic motor swashplate can be directly controlled by an electro-mechanical actuator rather than an electro-hydraulic valve. In some embodiments, both hydraulic motor pressure differential information and hydraulic motor displacement information can be used together to provide higher accuracy when indirectly determining a preload force.

Rather than utilizing motor rotor position information and amperage information, conversion actuator system 800 utilizes differential hydraulic pressure information. Conversion actuator system 800 further comprises a preload control system 820 comprising the hydraulics pump and controller system 822, a hydraulics pressure monitoring system 824, a motor position downstop preload relationship table 826, a preload translator 828, and a comparator controller 830. As shown, driver 808 comprises a shaft 831 and a hydraulic motor 832. Pressure differential downstop preload relationship table a 826 can be housed in a computer readable medium or memory and is configured to comprise information regarding a provided or determined relationship between a differential hydraulic pressure as measured by an input pressure sensor 823 and an output pressure sensor 825 and an applied downstop preload, as will be explained in greater detail below with reference to FIG. 11. Preload translator 828 is a module configured to receive information from both hydraulics pressure monitoring system 824 and table 826 to determine and report an estimated downstop preload value to comparator controller 830. Comparator controller 830 is configured to receive control information from flight control computer 120. In particular comparator controller 830 can receive an instruction from flight control computer 120 regarding a desired mode of flight, such as whether aircraft 100 is instructed to fly and the airplane mode or the helicopter mode. In situations where flight control computer 120 informs comparator controller 830 that airplane 100 is being commanded to fly in the airplane mode, comparator controller 830 can compare the estimated downstop preload value received from preload translator 828 to the desired final downstop preload for use in airplane mode flight. When comparator controller 830 determines that the estimated downstop preload received from preload translator 828 is less than the desired downstop preload, comparator controller 830 can instruct hydraulic pump and controller system 822 to continue rotating shaft 831 in a manner that increases the applied downstop preload. Similarly, when comparator controller 830 determines that the estimated downstop preload is greater than the desired downstop preload, comparator controller 830 can instruct hydraulic pump and controller system 822 to reverse rotation of shaft 831 to reduce the applied downstop preload.

Figure 11:
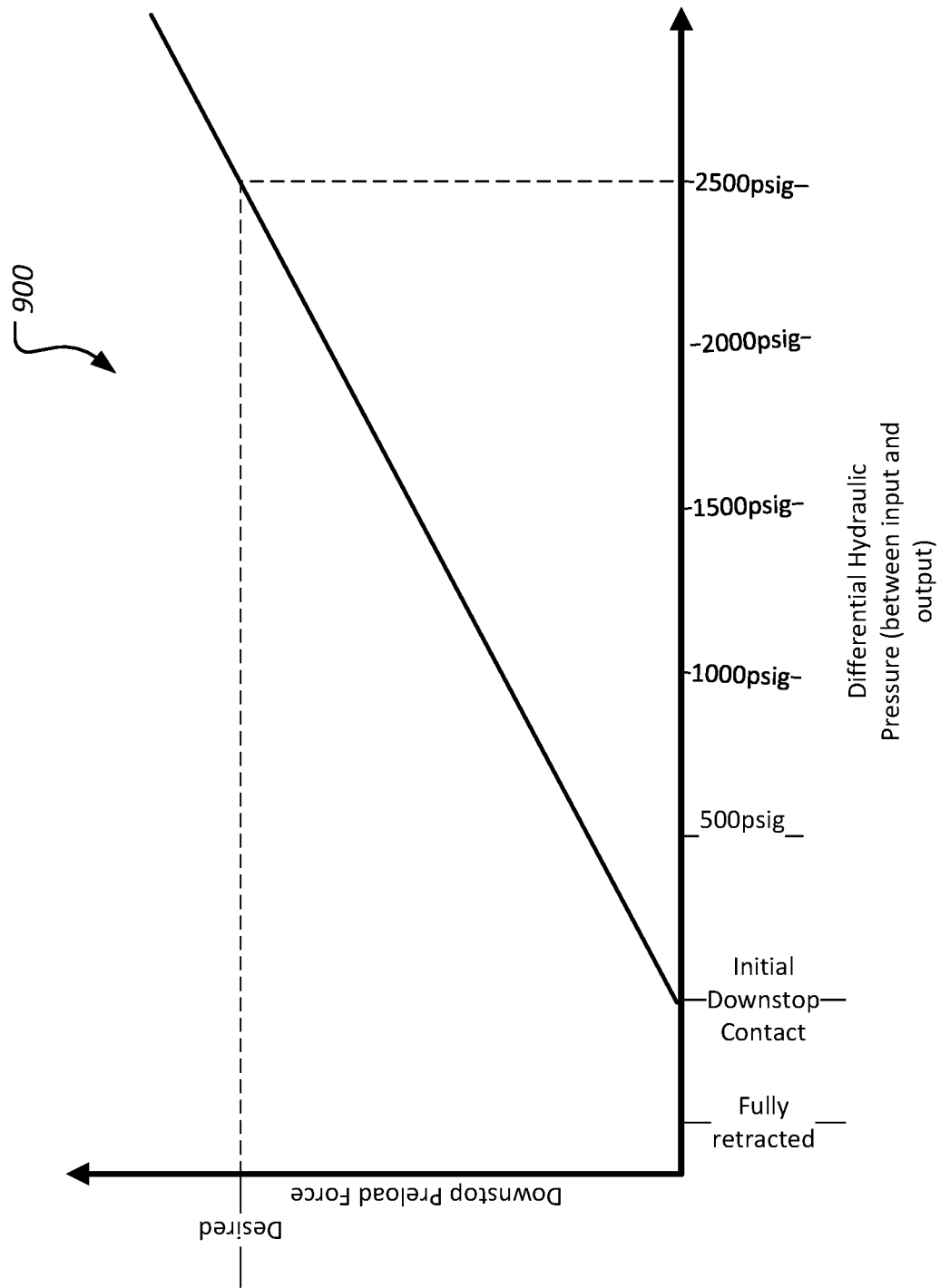
FIG. 11 is a chart showing a relationship between a pressure differential and a downstop preload.

Referring now to FIG. 11, a chart 600 is provided that shows a relationship between a hydraulic pressure differential (between an input and output) and a known or estimated downstop preload force. In some embodiments, the relationship can be determined through engineering modeling and simulations while in other embodiments, the relationship can be gathered by using additional instrumentation, such as, but not limited to, strain gages configured to assist with measuring applied forces. In some cases, a relationship can be determined on a first aircraft and subsequently utilized in the control of a second aircraft. As shown, no downstop preload force exists until the components being forced together actually contact each other. In some cases the relationship can be substantially linear and therefore a known amount of pressure differential can be used to estimate an applied downstop preload force.

Figure 12:
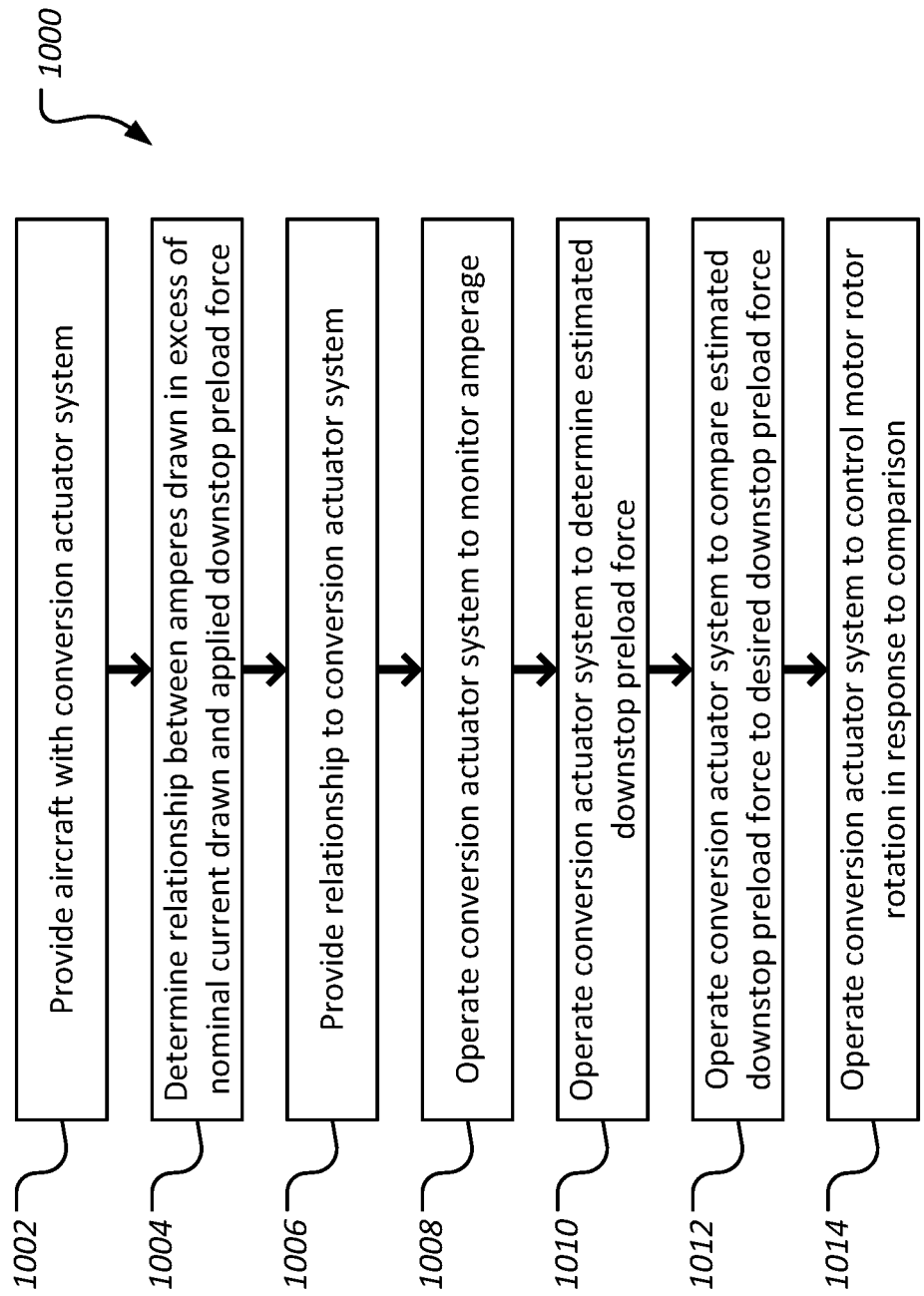
FIG. 12 is a flowchart of a method of operating the conversion actuator system of FIG. 10.

Referring now to FIG. 12, a flowchart of a method 1000 of operating conversion actuator system 800 is shown. Method 1000 can begin at block 1002 by providing an aircraft with a conversion actuator system such as conversion actuator system 800. Method 1000 can continue at block 1004 by determining a relationship between a hydraulic pressure differential and an applied downstop preload force. In some cases, the relationship can be determined from instrumentation on the aircraft while in other cases the relationship can be determined independent of the aircraft. Next, method 1000 can continue by providing the determined relationship to the conversion actuator system. In some cases, this involves storing the relationship and a memory in the form of a table such as pressure differential downstop preload relationship table 826. Next, at block 1008 the conversion actuator system can be operated to monitor a pressure differential between a hydraulic input and a hydraulic output. Next, at block 1010 the conversion actuator system can be operated to determine an estimated downstop preload force by translating a received measured pressure differential value into an estimated downstop preload force using the above-described relationship provided to the conversion actuator system. Method 1000 can continue at block thousand 12 by operating the conversion actuator system to compare an estimated downstop preload force to a commanded or desired downstop preload force. In some cases the commanded or desired downstop preload force can be provided to the conversion actuator system by a flight control computer such as flight control computer 120. Method 1000 can conclude by operating the conversion actuator system to control the hydraulic motor in response to the above-describe comparison so that, for example, if an estimated downstop preload force is lower than a desired or commanded downstop preload force, conversion actuator system can control the hydraulic motor to rotate the shaft in a manner that increases the estimated downstop preload force.

While the embodiments disclosed above generally relate to flight operations of an aircraft, some of the same components and methodology can be utilized while the aircraft is grounded to perform so-called health checks that can provide information regarding whether conversion actuator systems such as, but not limited to, systems 200, 500, and 800 are in good operating condition. For example, while the aircraft is grounded, a flight control computer or other test controller can be used to instruct the aircraft to move wings and/or rotor systems into an airplane mode configuration. Because the above-described predetermined relationships between downstop preload forces and various physical indicators, namely, motor rotor location, amperes drawn in excess of nominal, and pressure differential, the conversion actuator systems can be operated to provide actual performance data for inspection and comparison to the expected relationships. In some cases, the health checks can comprise temporarily adding measuring components such as, but not limited to, strain gages, to provide actual downstop preload information for comparison to the anticipated and known acceptable downstop preload values of the previously determined relationships. In a circumstance where a motor rotor position or location does not yield an expected downstop preload force, the systems may be inspected for gearing damage, slippage, and/or other impediments to expected outcomes. Similarly, wherein amperage is in excess of an expected current draw and is not yield an expected downstop preload force, the electrical motor may be inspected for a partial failure within the motor windings and/or bearings. Further, when a measured pressure differential does not follow an expected relationship to downstop preload forces, the system may be inspected for a hydraulic fluid leak and/or other impediments to system movement. As such, not only do the systems disclosed herein allow for improved control over downstop preload forces during flight and operation of an aircraft, they provide a useful opportunity for preflight checks of the systems themselves.

It will further be appreciated that while the systems disclosed herein are discussed in the context of providing downstop preload management in a tilt rotor aircraft, the same essential components and methodologies can be utilized in any other mechanical system to provide a desired preload or force interaction without requiring direct force measurement instrumentation. For example, the systems and methods disclosed herein can be used to manage aircraft landing gear preloads and preloads used for biasing an aircraft door in in a closed position, among other applications.

At least one embodiment is disclosed, and variations, combinations, and/or modifications of the embodiment(s) and/or features of the embodiment(s) made by a person having ordinary skill in the art are within the scope of this disclosure. Alternative embodiments that result from combining, integrating, and/or omitting features of the embodiment(s) are also within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 95 percent, 98 percent, 99 percent, or 100 percent. Moreover, any numerical range defined by two R numbers as defined in the above is also specifically disclosed.

Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention. Also, the phrases "at least one of A, B, and C" and "A and/or B and/or C" should each be interpreted to include only A, only B, only C, or any combination of A, B, and C.

What is claimed is:

1. A system, comprising:
   a driver monitor system configured to receive information about driver operation;
   a relationship table comprising information about an expected relationship between driver operation and a preload force; and
   a driver controller configured to control a driver in response to the information about driver operation and according to the relationship table;
   wherein the driver comprises a motor comprising a rotating component;
   wherein the relationship table associates the preload force to a number of revolutions of the rotating component; and
   wherein the information comprises a number of revolutions of the rotating component, the number of revolutions being at least one.

2. The system of claim 1, wherein the driver comprises an electric motor.

3. The system of claim 2, wherein the information about driver operation comprises motor rotor location information.

4. The system of claim 3, wherein the motor rotor location information is sensed by at least one of an optical sensor, a magnetic sensor, a hall effect sensor, an inductive sensor, a magneto-resistive encoder, a resistive encoder, a mechanical encoder, an optical encoder, a synchronizer, and a resolver.

5. The system of claim 2, wherein the information about driver operation comprises motor current draw information.

6. The system of claim 1, wherein the driver comprises a hydraulic motor.

7. The system of claim 6, wherein the information about driver operation comprises at least one of differential hydraulic pressure information and angular location information about a swashplate of the hydraulic motor.

8. The system of claim 6, further comprising:
an electro-hydraulic valve configured to control operation of the hydraulic motor.

9. The system of claim 8, wherein the differential hydraulic pressure information is based on a differential pressure between an hydraulic input to the hydraulic motor and a hydraulic output from the hydraulic motor.

10. An aircraft, comprising:
a first component;
a second component configured for compression against the first component at a desired preload force; and
an actuator system, comprising:
a driver monitor system configured to receive information about driver operation;
a relationship table comprising information about an expected relationship between driver operation and a preload force; and
a driver controller configured to control a driver in response to the information about driver operation and according to the relationship table;
wherein the driver comprises a motor comprising a rotating component;
wherein the relationship table associates the preload force to a number of revolutions of the rotating component; and
wherein the information comprises a number of revolutions of the rotating component, the number of revolutions being at least one.

11. The aircraft of claim 10, wherein the actuator system is configured for operation while the aircraft is not in flight.

12. A method of managing a preload force, comprising:
providing a first component;
providing a second component for compression against the first component;
operating a driver to move the first component into contact with the second component;
monitoring an operation of the driver;
determining an expected preload force in response to the operation of the driver;
wherein the operation comprises a number of revolutions of a rotating component of the driver, the number being greater than one.

13. The method of claim 12, wherein an expected relationship between operation of the driver and the expected preload force is provided in a relationship table.

14. The method of claim 13, wherein the relationship table comprises motor rotor movement information relative to the expected preload force.

15. The method of claim 13, wherein the relationship table comprises motor current draw information relative to the expected preload force.

16. The method of claim 13, wherein the relationship table comprises a differential hydraulic pressure relative to the expected preload force.

17. The method of claim 13, further comprising:
comparing an actual preload force to the expected preload force.

18. The method of claim 13, further comprising:
comparing a desired preload force to the expected preload force.

19. The method of claim 18, further comprising:
operating the driver in response to the comparison of the desired preload force to the expected preload force.

* * * * *